US006980212B2

(12) United States Patent
Letts

(10) Patent No.: US 6,980,212 B2
(45) Date of Patent: Dec. 27, 2005

(54) METHOD AND APPARATUS FOR COMPUTING THRESHOLDS FOR IDENTIFICATION OF WAVEFORM ANOMALIES

(75) Inventor: Peter J. Letts, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 137 days.

(21) Appl. No.: 10/125,306

(22) Filed: Apr. 17, 2002

(65) Prior Publication Data

US 2002/0180737 A1 Dec. 5, 2002

Related U.S. Application Data

(60) Provisional application No. 60/284,595, filed on Apr. 17, 2001.

(51) Int. Cl.[7] ......................... G99G 5/20; G01R 13/00; G01R 13/02

(52) U.S. Cl. ....................... 345/440.1; 702/66; 702/67; 702/69; 702/70; 702/71

(58) Field of Search ............................. 345/440, 440.1, 345/94; 315/1; 73/462, 602, 465, 596; 368/115; 702/66–69, 70–79, 179, 180

(56) References Cited

U.S. PATENT DOCUMENTS

| | | | | |
|---|---|---|---|---|
| 3,750,015 | A * | 7/1973 | Sheker et al. | 324/72.5 |
| 5,530,454 | A * | 6/1996 | Etheridge et al. | 345/440.1 |
| 5,758,129 | A * | 5/1998 | Gray | 345/572 |
| 5,986,637 | A * | 11/1999 | Etheridge et al. | 345/596 |
| 6,104,374 | A | 8/2000 | Sullivan et al. | |
| 6,151,010 | A * | 11/2000 | Miller et al. | 345/440.1 |
| 6,163,758 | A | 12/2000 | Sullivan et al. | |
| 6,188,384 | B1 * | 2/2001 | Sullivan et al. | 345/440.1 |
| 6,278,435 | B1 * | 8/2001 | Etheridge et al. | 345/440.1 |
| 6,333,732 | B1 * | 12/2001 | Gerlach et al. | 345/440.1 |

OTHER PUBLICATIONS

"Fundamentals of DSOs", Leroy Corporation, 1998.*

* cited by examiner

*Primary Examiner*—Sumati Lefkowitz
*Assistant Examiner*—Chante Harrison
(74) *Attorney, Agent, or Firm*—Thomas F. Lenihan; Francis I. Gray

(57) ABSTRACT

Apparatus in accordance with the subject invention maintains an exponentially decayed histogram of the counts of new pixels for each active channel, together with a running count of time and number of acquisitions. At regular intervals determined by a maximum time or by a minimum number of acquisitions it computes a new threshold for each active channel. This threshold will theoretically produce "N" nominally unusual waveforms per second where N is defined by a user "sensitivity" control. The raw histogram is smoothed to provide a stable "tail" of small probabilities. Once a threshold has been determined, subsequent waveforms with more than this number of new pixels are re-examined to determine the number of "really new" pixels. "Really new" pixels are defined as those that are not adjacent to pixels remaining from earlier acquisitions. Only those waveforms that have more "really new" pixels than a specified fraction of the basic threshold are reported as anomalies.

7 Claims, 2 Drawing Sheets

METHOD AND APPARATUS FOR COMPUTING THRESHOLDS FOR IDENTIFICATION OF WAVEFORM ANOMALIES

This application claims the benefit of Provisional Application No. 60/284,595, filed Apr. 17, 2001.

FIELD OF THE INVENTION

This invention relates to definition and detection of unusual waveforms acquired by a digital oscilloscope, and more particularly to a controllable definition and automatic detection of such waveforms.

BACKGROUND OF THE INVENTION

In analog oscilloscopes employing cathode ray tubes (CRTs) for display, variable brightness of the screen display communicates useful information about the activity of the signal being observed. As an analog oscilloscope generates vertical excursions during a horizontal sweep interval to provide a real-time picture of the signal activity at the probe tip, it inherently tends to vary the brightness of the display as an inverse function of the slope of the line it produces. This occurs because the cathode electron gun of the CRT generates a constant supply of electrons that depends on the setting of a "brightness" control, and the length of the trajectory covered in a unit of time is minimally determined by the x-axis distance associated with any particular sweep speed, but is increased by any and all y-axis excursions. And a y-axis excursion can be a large multiple of the corresponding x-axis distance, so the constant available electron beam energy appears to be reduced by a large factor as it is spread over this much longer distance. Thus, analog oscilloscopes inherently vary the brightness of the line they draw as an inverse function of the slope of that line.

Another even more highly desired feature of an analog oscilloscope or a digital oscilloscope with a high waveform throughput, is the ability to detect an intermittent signal anomaly that occurs in an otherwise repetitive signal. Older digital oscilloscopes, with low "live time" make observing intermittent signal activity improbable, at least in the absence of special trigger modes designed to detect certain classes of intermittent signal activity. Analog oscilloscopes will show a faint trace indicating the presence of this intermittent anomalous signal behavior. Of course, if the signal becomes too intermittent, the trace will be so faint in brightness that it may be missed entirely by the oscilloscope operator.

In a simple digital oscilloscope having only a single bit (on/off) of intensity information per pixel, operated with its persistence decay feature turned off (i.e., infinite persistence), will display rare or unusual waveforms with the same intensity as highly repetitive ones, i.e., "on". In contrast, digital oscilloscopes with multi-bit raster memories can provide variable intensity (or variable color) displays to allow a visual distinction to be made between rare and repetitive waveforms. However, unless the persistence feature is turned off, these oscilloscopes may not illuminate truly rare events with enough intensity for a long enough period of time to allow the operator to notice, much less analyze, the intermittent activity.

Current oscilloscope products from assignee corporation, Tektronix, provide a means whereby the operator can distinguish between the most recent individual waveform acquisitions and older waveforms acquired previously. The Tektronix TDS3000 oscilloscope defines and detects unusual waveforms it acquires in a way that allows the definition of an unusual waveform to be controlled by the operator while the detection of the waveforms is then automatically performed by the oscilloscope. U.S. Pat. No. 6,163,758 (Sullivan, et al.), entitled Detection of Unusual Waveforms, assigned to the same assignee as the subject invention, discloses the manner in which such unusual waveforms are detected. Specifically, it detects unusual waveforms by counting the number of new pixels that are drawn on its screen display, and generating an alert signal if the number of new pixels exceeds a threshold value. That is, the number of "new" pixels that unusual or anomalous waveforms affect automatically distinguish them from normal, highly repetitive, waveforms. "New" pixels can be defined to mean those pixels that have never been previously touched by any waveform since the beginning of the present acquisition series, or those which have not been affected for some interval of time as measured by the decay of values stored in a raster memory. User input can affect the definition of unusual waveforms by affecting the definition of "new" pixels (i.e., threshold value) and by affecting the decay rate applied to the values stored in the raster memory.

While the system of U.S. Pat. No. 6,163,758 performs well, what is needed is a system that determines the threshold and updates it dynamically, and in a post-detection mechanism also discards unusual waveforms that are due to noise rather than a significant anomaly.

SUMMARY OF THE INVENTION

Apparatus in accordance with the subject invention maintains an exponentially decayed histogram of the counts of new pixels for each active channel, together with a running count of time and number of acquisitions. At regular intervals determined by a maximum time or by a minimum number of acquisitions it computes a new first threshold value for each active channel. This threshold will theoretically produce "N" nominally unusual waveforms per second where N is defined by a user "sensitivity" control. A raw histogram of the frequency of new pixels is smoothed to provide a stable "tail" of small probabilities. Once a second threshold has been determined, subsequent waveforms with more than this number of new pixels are re-examined to determine the number of "really new" pixels. "Really new" pixels are defined as those that are not adjacent to pixels remaining from earlier acquisitions. Only those waveforms that have more "really new" pixels than a specified fraction of the basic threshold are reported as anomalies.

DETAILED DESCRIPTION OF THE DRAWING

Figure 1:
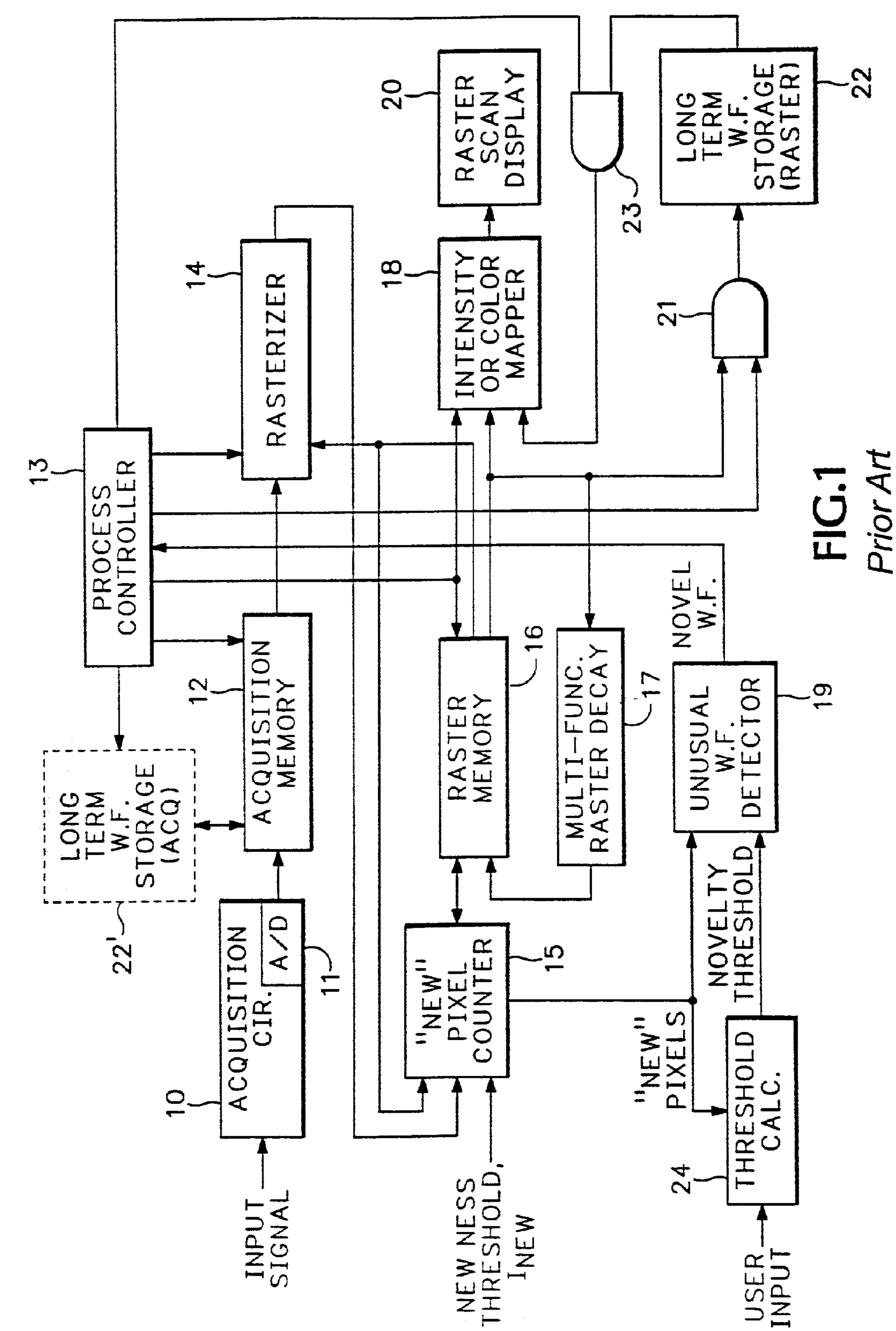
FIG. 1 is a conceptual block diagram showing how the present invention may be implemented in conjunction with conventional digital oscilloscope acquisition, rasterization, and display functions.

FIG. 1 is a conceptual block diagram only, and various parts of it could be implemented in either hardware or software, or could be made to function or interoperate differently, without departing from the broad idea of the invention discussed below.

The circuitry of FIG. 1 is known from the prior art Tektronix TDS3000 oscilloscope mentioned above. Acquisition circuitry 10 tracks and periodically samples an input signal being monitored by the aforementioned oscilloscope. Analog-to-digital converter 11 produces as its output a stream of binary values describing the amplitude of the input signal tracked by the acquisition circuitry. These amplitude values are stored at sequentially related addresses in the acquisition memory 12. The resulting data-address pairs are subsequently sent to rasterizer 14 according to directions from a process controller 13.

The rasterizer 14 converts a single data-address pair into a dot or converts a sequential pair of data-address pairs into a vector, mapping the resulting points into a two-dimensional array of rows and columns that will eventually be displayed on raster display 20. The rasterizer 14 typically operates on one column of the raster at a time, performing read-modify-write operations on each memory location in the raster memory 16 that is affected by the current dot or vector being generated. Further information regarding details of the alternatives available for the operation of this circuitry is available in U.S. Pat. No. 6,104,374, for "Sparse Vector Rasterization" (Sullivan, et al.), issued 15 Aug. 2000, and herein incorporated by reference.

The process controller 13 operates to coordinate the activities of the acquisition memory 12, the rasterizer 14, and the raster memory 16, in any one of a number of manners that are well known in the prior art, and additionally performs new functions in accordance with several aspects of the present invention. The "new" pixel counter 15 operates in accordance with the present invention as will be further described below. The multi-function raster decay 17 is a modified version of prior art single-function raster decay generators. Similarly, the intensity or color mapper 18 is a variation on earlier circuitry, but adapted for use in the TDS3000 oscilloscope. A threshold calculator 24 and an unusual waveform detector 19 are also known from the prior art. Long term waveform storage memories, both raster memory version 22 and acquisition record memory version 22' are available in the prior art.

"New" pixel counter 15 keeps track of how many pixels that are being "hit" by this waveform rasterization pass have never been hit before within the present series of waveform acquisitions. This approach was implemented in the TDS3000 oscilloscope by the use of a one bit pixel map dedicated to keeping track of all pixels that have ever been used. Such a single bit pixel map was implemented by the use of a reserved bit in the main raster memory.

The "new" pixel counter 15 keeps track of how many pixels that are being hit during this waveform rasterization pass have less than a minimum newness threshold value stored in their raster memory location. The determination of whether a pixel is "new" or not can also be made by examining the value read out of the raster memory 16 as the rasterizer 14 performs read-modify-write operations. If the value read out of the raster memory 16 is less than a newness threshold value, then the associated pixel is counted as being "new". The newness threshold value can be zero or positive, and the value from the memory location can have reached a value equal to or less than it in a variety of ways. For example, that location could have never been affected by a previous waveform in this series of acquisitions and therefore still be zero. Or, it could have been hit "lightly" and infrequently, and subsequently undergone a small number of decay cycles until its value became lower than the threshold value. Or, it could have been hit "heavily" many times and subsequently undergone a large number of decay cycles to reach the low level below the threshold value. Or, it could have undergone some mixture of the latter two possibilities and eventually ended up below the threshold value as the result of a somewhat "random walk" of additions and subtractions over time. Thus, while the detection of a new pixel means that it has not been affected for some length of time, that amount of time can be highly variable.

As will be further described below, the intensity or color mapper 18 may be programmed to map raster location stored values below a certain threshold into zero intensity values in the raster scan display 20. This will typically be done in conjunction with the use of a multi-function raster decay generator 17, the operation of which will also be described in further detail below. In this mode of operation, the minimum value added by the rasterizer 14 to indicate a "hit" will be larger than the predetermined number of recent cycles desired. Adding values greater than such a minimum value permits the use of some of that value to produce visible raster decay cycles and the remainder to be used in "invisible" decay cycles that serve a counter/timer function without causing illumination on the display. Values in the invisible region are all mapped to zero intensity by intensity or color mapper 18. This, and other, uses of the multi-function raster decay generator 17 are further described in detail below.

It should be noted that in some implementations, in particular those that only have a single display plane and supporting raster memory, the use of an "invisible" region can add undesired complications. In particular, if multiple waveforms are being drawn in a single plane according to a priority scheme whereby lower priority waveforms are overwritten by higher priority waveforms, and nothing is done to treat the invisible regions as a special case, the invisible regions in the top priority waveform can lead to blank areas in the underlying waveforms which would otherwise show through in those areas.

It should also be noted that some raster scan displays 20 produce dark waveforms on a light background. Therefore, the expression "zero intensity" as used throughout this document, including the claims, may be intended, if applied to this type of display, to mean the lightest possible value in the display instead of the darkest.

After each waveform rasterization, the "new" pixel counter 15 provides the number of "new" pixels to the threshold calculator 24 and to the unusual waveform detector 19. The threshold calculator 24 may or may not utilize user input in formulating a novelty threshold that it provides to the unusual waveform detector 19. The unusual waveform detector 19 compares the "new" pixels information that it receives from the "new" pixel counter 15 with the novelty threshold that it receives from the threshold calculator 24 and by comparing them determines if a novel waveform appears to be present. If so, an active novel waveform signal informs the process controller 13 of this event.

The presence of an active novel waveform input to the process controller 13 causes it to take several actions, some of which may depend on user choices. It can cause the re-rasterization of the unusual waveform using maximum intensity values. "Maximum" here can mean any one of several things or their combination. One meaning of maximum is simply to use the highest value of pixel intensity that is normally used. Another meaning is to use a "super-maximum", a value that is at the top of a region of values that are all brighter than those values used for displaying normal waveforms. Another meaning of "maximum" can be to switch from dots to vectors, so that many more pixels are illuminated, as well as illuminating those pixels with a maximum intensity according to either one of the above definitions. Yet another meaning of "maximum" can be to switch from vectors defined by illumination of a subset of their possible dots, to vectors illuminated by more or all of their possible dots.

In addition to, or instead of, increasing the intensity of the unusual waveform, the process controller 13 can cause the acquisition memory 12 to provide the data record that produced the unusual waveform to long term waveform (acquisition) storage memory 22'. Alternatively, the process controller 13 can cause the raster memory 16, via AND gate 21, to provide the raster memory image containing the unusual waveform to long term waveform storage (raster) memory 22. It can also store the waveform both ways, if so desired. Generally, it is desirable to re-rasterize and maximally brighten an unusual waveform before storing it in the long term raster waveform storage 22. The process controller 13 can also stop further acquisitions and "freeze" the display, particularly after having the unusual waveform re-rasterized with maximum brightness.

The threshold calculator 24 can be controlled or preprogrammed to respond to the beginning of a new series of acquisitions by first ignoring an initial set of "new" pixels data, that data being from the first waveforms rasterized in the new series of acquisitions, and then saving the "new" pixels data associated with a typical sample set of waveform rasterizations. The purpose of discarding the data associated with the first waveforms is based on the knowledge that they will have many more "new" pixels than later, more typical waveforms, because they are being drawn over a relatively blank display (see also FIG. 2 of the subject specification, step 210, YES path). Once this initial suspect data has been discarded, and enough "usual" waveforms have been used to define a typical number expected "new" pixels per waveform, this data can then be used to calculate a mean and a standard deviation from that mean, and those values can then be used to form a suitable novelty threshold value for sending to the unusual waveform detector 19.

U.S. Pat. No. 6,163,758 (Sullivan, et al.), teaches that user input to the threshold calculator 24 can be used to affect the novelty threshold in a number of ways. It can directly set it. It can determine the size of the initial set of waveforms to be discarded, and/or the size of the set of typical waveforms used to calculate the mean and standard deviation. Or, it can be used to determine how many standard deviations, or fractions thereof, from the mean should be considered "normal" in determining the value of the novelty threshold.

Because unusual waveforms are so rare, they need to be brighter and to decay more slowly in order to stand out enough to be adequately perceived by the oscilloscope operator. For example, a system according to U.S. Pat. No. 6,163,758 (Sullivan, et al.) employs a three range decay arrangement in which a decay function for a TOP region, $F_T$, can also be made to provide a slow rate of decay, so that unusual waveforms are not only given maximum brightness, but tend to stay that way for a significantly longer amount of time. In contrast, the more numerous usual waveforms not only start out less bright, but also decay in brightness more quickly according to a decay function, $F_M$, used in the MIDDLE region. However, this lesser level of maximum brightness is compensated for by the relatively numerous hits associated with normal waveforms. A BOTTOM region of intensity-related values can be decayed by a relatively slow function, $F_B$, to provide a relatively gray historical background that fades very slowly.

Figure 2:
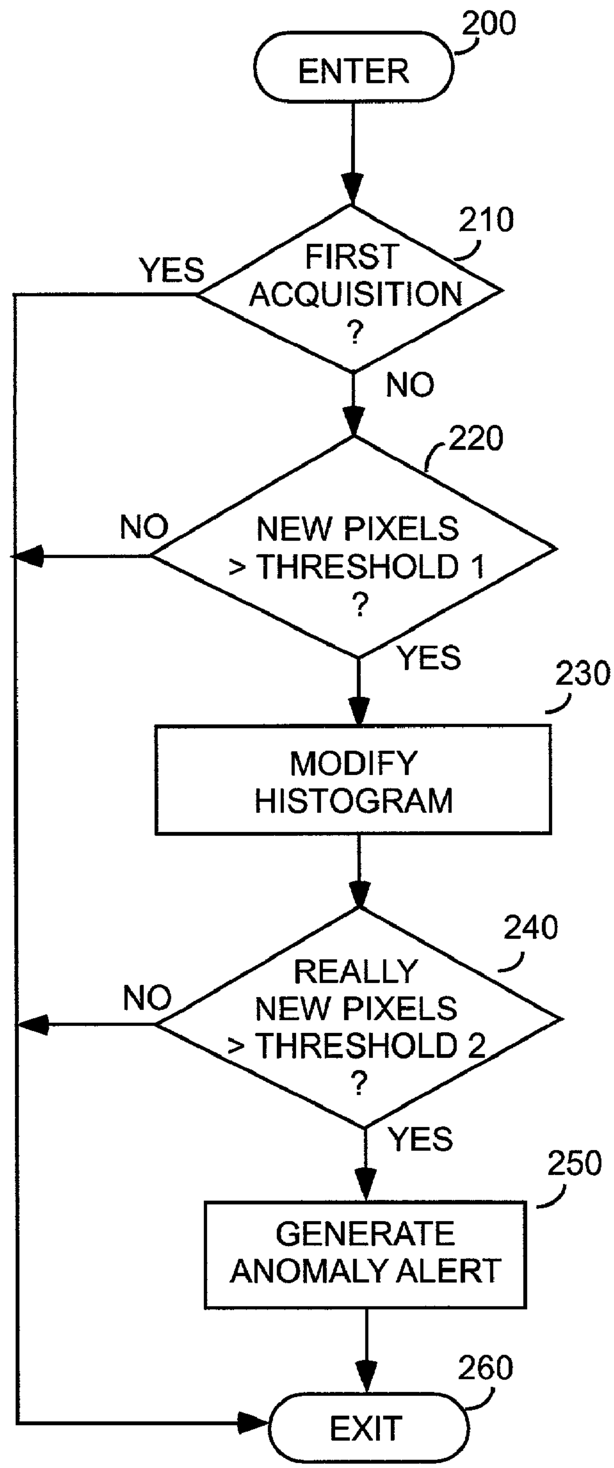
FIG. 2 is a flowchart of the process of determining and updating a "new" pixel threshold value in accordance with the subject invention.

The subject invention will now be described below with respect to FIG. 2.

The routine is entered at step 200 with a preliminary value for Threshold 1. As noted above, no determination of new pixel count need be made for the first acquisition, because substantially all pixels will be new. Thus, at step 210, the YES path will be followed, and the routine exited (step 260). At regular intervals determined by a maximum time or by a minimum number of acquisitions it computes a new threshold for each active channel. This threshold will theoretically produce "N" nominally unusual waveforms per second where N is defined by a user "sensitivity" control (step 220).

Apparatus in accordance with the subject invention maintains an exponentially decayed histogram of the counts of new pixels for each active channel, together with a running count of time and number of acquisitions (step 230). The raw histogram is smoothed to provide a stable "tail" of small probabilities. Once a threshold has been determined, subsequent waveforms with more than this number of new pixels are re-examined to determine the number of "really new" pixels (step 240). "Really new" pixels are defined as those that are not adjacent to pixels remaining from earlier acquisitions. Only those waveforms that have more "really new" pixels than a specified fraction of the basic threshold are reported as anomalies (step 250).

When a Tektronix TDS3000B-series Digital Phosphor Oscilloscope (DPOs) is used in fast trigger mode, up to 3600 waveforms per second are acquired and displayed, so the term "anomalies" implies those changes that occur in less than 1/3000 sec. Preferably, an anomalous waveform is displayed in a distinctive color and can be retained on the display screen and/or recorded on hardcopy or to floppy disk. All active waveforms including DPO math are processed in accordance with the teaching of U.S. Pat. No. 6,163,758 (Sullivan, et al.) as modified by the subject invention including a sensitivity control that allows users to adjust a change detection level to match their own waveform variability.

A Digital Phosphor Oscilloscope (DPO) simulates the display of an analog oscilloscope having a CRT wherein an electron beam traces a waveform through x (time) and Y (voltage) deflectors on to the CRT phosphor screen. Each new waveform adds a value to display memory for each point that it crosses, and an independent decay process reduces the values at every point in display memory 60 times a second. The addition is limited to a maximum value of 511 and the reduction is limited to a minimum value of 0. The values in display memory are mapped though color look up tables to give 16 brightness levels on the display screen. Thus, at any instant when a new waveform is about to be drawn, points in display memory have values ranging from 0 to 511 and non-zero points provide a history of recent waveform acquisitions. As described above, this history is used to determine if the new waveform has changed significantly from those preceding it; its initial determination is made by counting the number of zero-valued points that are written-to while drawing the new waveform.

In contrast to the prior art described above, if this count exceeds a primary threshold (THRESHOLD 1), the points next to the new waveform are examined to determine the number of "really new" points. "Really new points" are those whose neighbors are also new, and if their count exceeds a secondary threshold (THRESHOLD 2), the waveform is assumed to be an anomaly.

Waveform intensity and persistence control are achieved by changing the amount that is added for each new waveform and/or by changing the decay reduction factor. Increasing waveform intensity and/or persistence provide a thicker trace and increases the number of non-zero points in display memory. In the extreme case of infinite persistence, every point of every waveform is retained in display memory and never decays. The ability to detect waveform changes depends significantly on the dynamic balance between new waveforms being drawn and old waveforms decaying away. While the default values of waveform intensity, persistence and sensitivity give good general performance, users may wish to experiment with other settings for their own applications.

The number of zero-valued, or new, points that are written to display memory is recorded after each acquisition as frequency histograms for each active waveform. Each frequency is proportional to the probability that a new waveform will have the corresponding number of new points, and the sum of frequencies corresponding to counts greater than a given threshold is proportional to the probability that a new waveform will have at least that number of new points. The current time is noted after every 200 acquisitions and the time delta from the previous cycle is used to compute an acquisition rate. The acquisition rate and the frequency distribution are used to determine a new points threshold which will be exceeded by N acquisitions per second.

For example, if there were 1000 acquisitions per second, the frequency distribution were as shown in Table 1 below, and N were 5 then, "What is the threshold that will be exceeded by 5 out of 1000 acquisitions, or that has a cumulative probability of at least 0.995?

TABLE 1

| Count | Frequency | Cumulative Probability |
|---|---|---|
| | 0 | 0.000 |
| 50 | 25 | 0.100 |
| 51 | 100 | 0.500 |
| 52 | 75 | 0.800 |
| 53 | 30 | 0.920 |
| 54 | 10 | 0.960 |
| 55 | 5 | 0.980 |
| 56 | 3 | 0.992 |
| — | 0 | 0.992 |
| 60 | 1 | 0.996 |
| — | 0 | 0.996 |
| 70 | 1 | 1.000 |
| — | 0 | 1.000 |
| Total | 250 | |

An estimated threshold for the blank line in Table 1 is computed as follows: estimated threshold=56+(60−56)*(0.995−0.992)/(0.996−0.992)=59. The number of acquisitions per second that exceed the primary threshold is determined by the sensitivity control. The default 50% should produce one potential anomaly per second; each increase or decrease of 6% will double or halve the number of potential anomalies per second. For example a sensitivity of 62% should produce 4 anomalies per second, while 32% should produce an anomaly every 8 seconds.

A single waveform decays away very quickly, however, the multiple decay rate capability of TDS3000 hardware allows anomalous waveforms to be retained long enough to be useful. A general purpose knob is used for sensitivity control, and a waveform intensity knob is used to control this anomaly decay rate. Note that normal waveform intensity and persistence cannot be changed while operating in this mode because that would adversely affect threshold determination.

The TDS3000 oscilloscope uses a ping-pong acquisition/rasterization system in which all active channels are acquired simultaneously into a "ping" buffer, and then rasterized sequentially from this "ping" buffer while the next acquisition occurs into a "pong" buffer. Once rasterization is complete, the buffers "ping-pong" (i.e., alternate) and the process continues. A host controller (which may be, for example, a PowerPC® microcomputer) is interrupted after each channel is rasterized to provide the new pixel count and perform any subsequent processing. The host controller may also be interrupted again after all rasterizations are complete to perform such high-level functions as beep, stop, save anomalies to disk or hardcopy.

The processing sequence for each rasterization interrupt is shown as follows.

```
sanity check for valid active channel
increment frequency for count of new pixels
if global reset (e.g. front panel change)
  re-initialize histograms and other statistics
else
  if time to update thresholds
    compute acquisition rate
    find threshold for required potential anomalies per
      second (1)
    decrement frequencies by 63/64 (2)
    save new time
    zero acquisition count
if start skip with this channel (3)
  set skip count and disable start skip
if skip count is zero and new pixel count exceeds primary
  threshold
  retrace waveform to count really new pixels
  if really new pixels count exceeds secondary threshold
    redraw
    waveform in amber
    enable interrupt after all rasterizations for this acqui-
      sition
    enable start skip and note channel
else
  decrement skip count
tell rasterizer to continue
```

The processing sequence for interrupts after all rasterizations of a single acquisition are complete is as follows

```
if hardcopy or save waveforms to disk
  disable acquisitions
  turn off decay machine
send message to command level that an anomaly has been
  detected if stop
on anomaly
  turn off decay machine
  send stop message
if acquisitions will stop
  enable Wave Alert global reset
else
  continue acquisitions
```

It should be noted that, the example given above is typical in that a threshold has to be estimated from a very sparse region of a frequency distribution. To limit large threshold changes (and corresponding erratic anomaly detection behavior) the frequency distribution is smoothed with a 31 point low pass filter before the threshold is estimated.

It should also be noted that reducing a frequency of 1 by 63/64 produces 0 so remainders are carried forward to the next histogram bin. For example, if the bins are (10, 3, 0, 0, 1, 0, 0, 0, 1} the reduction process produces:

(10*63+0)/64=630/64=9, remainder 56
(3*63+56)/64=245/64=3, remainder 53
(0*63+53)/64=53/64=0, remainder 53
(1*63+53)/64=116/64=1, remainder 52
(0*63+52)/64=52/64=0, remainder 52
(1*63+52)/64=115/64=1, remainder 51 thereby retaining the tail of the distribution.

It should further be noted that anomaly processing disturbs the dynamic balance between new waveform drawing and the decay process. So, after each potential anomaly is processed, an empirically determined number of rasterizations are skipped. To ensure that all channels in the current acquisition are tested as anomalies the skip does not start until a full cycle of waveforms has been tested.

While a preferred embodiment of the present invention has been shown and described, it will be apparent to those skilled in the art that many changes and modifications may be made without departing from the invention in its broader aspects. For example, wherever the phrase "intensity-related values" is used, the phrase "color-related values" could be used instead or as well. The claims that follow are therefore intended to cover all such changes and modifications as are permitted by the patent laws of the respective countries in which this patent is granted.

What is claimed is:

1. A method for automatically detecting unusual waveforms during monitoring of a generally repetitive electrical signal by a digital oscilloscope, the method comprising the steps of:

determining a number of "new" pixels affected by each waveform rasterization process after an initial cycle of acquisitions;

forming a histogram of a frequency of "new" pixels over a defined cycle of acquisitions, the histogram being updated periodically;

using the histogram to define a first threshold number of pixels;

comparing the determined number of "new" pixels for a subsequent waveform rasterization with the first threshold number of pixels;

if the determined number of "new" pixels is more than the first threshold number of pixels, re-examining the subsequent waveform rasterization to determine a number of "really new" pixels;

comparing the determined number of "really new" pixels with a second threshold number of pixels derived from the first threshold number of pixels; and if the determined number of "really new" pixels is more than the second threshold number of pixels, classifying the subsequent rasterized waveform as an unusual waveform.

2. The method for automatically detecting unusual waveforms according to claim 1 wherein the "really new" pixels have no neighboring pixels remaining from an earlier acquisition.

3. Apparatus for use in a multichannel digital oscilloscope for automatically detecting unusual waveforms, comprising:

an acquisition system for acquiring samples of a signal under test;

processing circuitry for converting said samples to waveform pixels for display;

a display for displaying said pixels of said waveforms; and a controller for controlling said acquisition circuitry, said processing circuitry, and said display unit;

said controller maintaining a histogram of the counts of new pixels for each active channel;

said controller periodically computing a first threshold value for each active channel from the histograms;

if the count of new pixels for one of the active channels exceeds the corresponding first threshold value, said controller determining really new pixels by comparing each new pixel with neighboring pixels to determine if said neighboring pixels remain from an earlier acquisition;

only those waveforms that have more really new pixels than a second threshold derived from the first threshold are reported as anomalies.

4. The method according to claim 1 wherein the forming step further comprises the step of smoothing the histogram prior to the using step.

5. The method according to claim 1 wherein the using step comprises the steps of:

setting a sensitivity value that correlates to a theoretical frequency of unusual waveforms; and applying the sensitivity value to the histogram to determine the first threshold number of pixels.

6. The method according to claim 1 further comprising the step of re-initializing the automatically detecting method after an unusual waveform is detected.

7. The method according to claim 1 further comprising the step of decaying the histogram prior to each update.

* * * * *